(12) United States Patent
Kawada

(10) Patent No.: US 7,503,109 B2
(45) Date of Patent: Mar. 17, 2009

(54) METHOD OF MOUNTING AN ELECTRONIC COMPONENT

(75) Inventor: Seiichi Kawada, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 191 days.

(21) Appl. No.: 11/481,181

(22) Filed: Jul. 6, 2006

(65) Prior Publication Data

US 2006/0248714 A1   Nov. 9, 2006

Related U.S. Application Data

(62) Division of application No. 11/016,401, filed on Dec. 20, 2004, now Pat. No. 7,096,648, which is a division of application No. 10/442,977, filed on May 22, 2003, now Pat. No. 6,860,391.

(30) Foreign Application Priority Data

May 27, 2002   (JP)  ............... 2002/152602

(51) Int. Cl.
*H05K 3/30* (2006.01)
(52) U.S. Cl. ............... 29/832; 29/825; 29/833; 29/840
(58) Field of Classification Search .......... 29/825, 29/832, 833, 840
See application file for complete search history.

(56) References Cited

U.S. PATENT DOCUMENTS

| | | | | |
|---|---|---|---|---|
| 4,476,626 A * | 10/1984 | Gumbert et al. | ............... | 29/740 |
| 4,494,902 A * | 1/1985 | Kuppens et al. | ............... | 221/74 |
| 4,662,514 A | 5/1987 | Berbeco | | |
| 4,740,136 A * | 4/1988 | Asai et al. | ............... | 414/787 |
| 4,835,846 A * | 6/1989 | Juan et al. | ............... | 29/840 |
| 5,025,923 A | 6/1991 | Okui | | |
| 5,136,827 A | 8/1992 | Sawaya | | |
| 5,203,143 A | 4/1993 | Gutentag | | |
| 5,524,765 A * | 6/1996 | Gutentag | ............... | 206/713 |
| 5,648,136 A * | 7/1997 | Bird | ............... | 428/76 |
| 5,747,139 A | 5/1998 | Schenz | | |
| 5,757,199 A | 5/1998 | Maruyama | | |
| 5,828,224 A | 10/1998 | Maruyama | | |
| 5,839,187 A * | 11/1998 | Sato et al. | ............... | 29/743 |
| 5,846,621 A * | 12/1998 | Nagamatsu | ............... | 428/40.1 |
| 5,986,459 A | 11/1999 | Fukaya et al. | | |
| 6,190,115 B1 * | 2/2001 | Suzuki et al. | ............... | 414/752.1 |
| 6,216,419 B1 | 4/2001 | Sakurai | | |

(Continued)

FOREIGN PATENT DOCUMENTS

JP   01199868   8/1989

(Continued)

*Primary Examiner*—C. J Arbes
(74) *Attorney, Agent, or Firm*—Volentine & Whitt, P.L.L.C.

(57) ABSTRACT

An apparatus for storing an electronic component, the electronic component having a first surface and an opposite second surface, the apparatus includes a first film having a pocket that stores the electronic component and wherein the pocket has a protrusion at a bottom and wherein a top of the protrusion contacts with the second surface of the electronic component, and a second film covering the pocket and wherein a part of the second film is stuck to the first surface of the electronic component by a pressure difference so that the electronic component does not move freely.

8 Claims, 5 Drawing Sheets

U.S. PATENT DOCUMENTS 6,340,088 B1 1/2002 Mouri et al.
6,751,853 B2 * 6/2004 Farnworth et al. ............ 29/743
2006/0248714 A1 * 11/2006 Kawada ....................... 29/832

FOREIGN PATENT DOCUMENTS

| | | |
|---|---|---|
| JP | 02180181 | 7/1990 |
| JP | 05213309 | 8/1993 |
| JP | 06072407 | 3/1994 |
| JP | 2000043979 | 2/2000 |

* cited by examiner

US 7,503,109 B2

METHOD OF MOUNTING AN ELECTRONIC COMPONENT

CROSS REFERENCE TO RELATED APPLICATIONS

This is a divisional application of application Ser. No. 11/016,401, filed Dec. 20, 2004, now U.S. Pat. No. 7,096,648, which is a divisional application of application Ser. No. 10/442,977, filed May 22, 2003, now U.S. Pat. No. 6,860,391, which are hereby incorporated by reference in their entirety for all purposes.

BACKGROUND OF THE INVENTION

1. Field of the Invention

The present invention relates, in general, to an apparatus and method for storing an electronic component, a method for packaging electronic components and a method for mounting an electronic component and, more particularly, to a tape carrier package.

This is a counterpart of and claims priority to Japanese patent application Ser. No. 152602/2002, filed on May 27, 2002, the subject matter of which is incorporated herein by reference.

2. Description of the Related Art

A conventional apparatus for storing an electronic component, in particular to be able to be winded onto a reel, is called an embossed carrier type tape. The conventional embossed carrier tape comprises an embossed carrier tape having a plurality of pockets in series, and wherein each pocket stores the electronic component, and a cover tape covering the first tape. The conventional embossed carrier type tape is winded onto the reel, and is carried to somewhere as it is. When the electronic components are mounted on a substrate, firstly the cover tape is peeled away from the embossed carrier tape, secondly the stored electronic components are extracted from the pockets of the embossed carrier tape, and finally the extracted electronic components are mounted on the substrate.

However, the electronic components which are stored in the conventional embossed carrier type tape freely move in the pockets due to shock or vibration during carrying. Therefore, terminals of the electronic components which are stored in the conventional embossed carrier type taping may be bent.

SUMMARY OF THE INVENTION

According to one aspect of the present invention, there is provided an apparatus for storing an electronic component, the electronic component having a first surface and an opposite second surface, the apparatus includes a first film having a pocket that stores the electronic component and wherein the pocket has a protrusion at a bottom and wherein a top of the protrusion contacts with the second surface of the electronic component, and a second film covering the pocket and wherein a part of the second film is stuck to the first surface of the electronic component by a pressure difference so that the electronic component does not move freely. The novel features of the invention will more fully appear from the following detailed description, appended claims and the accompanying drawings.

DETAILED DESCRIPTION OF THE PREFERRED EMBODIMENTS

The preferred embodiments of the present invention will be described. However, the invention is not limited to the specific embodiments. Moreover, not all the combinations of the characteristics of the present invention described in the embodiments are essential to the present invention.

Figure 1A:
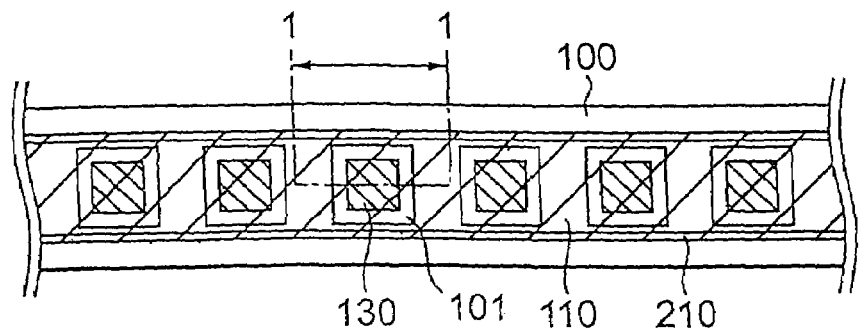
FIGS. 1(a)-1(c) are a top plan view and respective cross sectional views of an apparatus for storing an electronic component, according to a first preferred embodiment of the present invention.
Figure 1B:
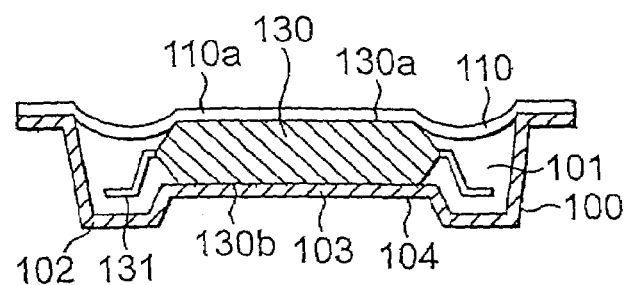
Figure 1C:
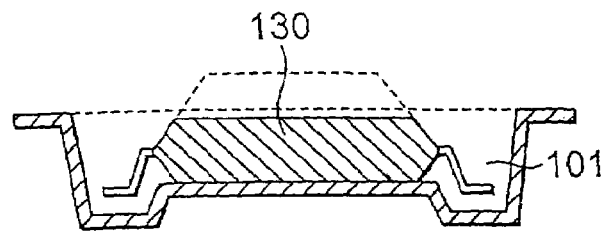

An apparatus for storing an electronic component according to a first preferred embodiment of the present invention will be described with reference to FIGS. 1(a)-1(c). FIG. 1(a) is a top plan view of the apparatus according to the first preferred embodiment of the present invention. FIG. 1(b) is a cross sectional view taken on line 1-1 of FIG. 1(a). Also, FIG. 1(c) is a cross sectional view taken on line 1-1 of FIG. 1(a).

The apparatus for storing an electronic component 130 according to the first preferred embodiment of the present invention comprises a first film 100 and a second film 110. Generally, the apparatus is called an embossed carrier type tape. Also, the first film 100 is called an embossed carrier tape, and the second film 110 is called a cover tape. By the way, the electronic component 130 has a first surface 130a and an opposite second surface 130b. Also, the electronic component 130 has a plurality of terminals 131 which are used for connecting to a substrate.

The first film 100 of the apparatus has a plurality of pockets 101 in series. Each pocket 101 stores a respective electronic component 130. Each pocket 101 has a protrusion 103 at a bottom 102, wherein a top 104 of the protrusion 103 contacts with the second surface 130b of the electronic component 130. The second film 110 covers the pocket 101 of the first film 100, wherein a part 110a of the second film 110 is stuck to the first surface 130a of the electronic component 130 by a pressure difference, so that the electronic component 130 does not move freely.

The apparatus has a flexibility so as to be windable onto a reel. Generally, an organic substance or a paper may be used as materials of the apparatus. The apparatus made of an organic substance provide airtight pockets that are resistant to dampness. Needless to say the apparatus made of paper also can be effective if the paper is capable of making pockets of high airtightness that are resistant to dampness. In this preferred embodiment of the present invention, the material of the first film 100 may be polyvinyl chloride (PVC), polystyrene (PS), polyethylene terephthalate (PET), or polycarbonate (PC), or the like. The material of the second film 110 is polyethylene (PE), polyethylene terephthalate (PET), or polystyrene (PS), or the like.

As shown in FIG. 1(c), in order to ensure that the first surface 130a of the electronic component 130 and the second film 110 stick together well, it is desirable that the electronic component 130 does not extremely protrude from the pocket 101. However, even though the electronic component 130 protrudes from the pocket 101, it is not worth considering if the electronic component 130 does not move freely.

The pocket 101 of the first film 100 is covered with the second film 110. The pocket 101 has one horizontal bottom 102 and a vertical side wall, wherein the side wall is provided on the bottom 102. The electronic component 130 is stored in an internal space of the pocket 101 which is made by the bottom 102, the side wall and the second film 110. In this preferred embodiment of the present invention, the pressure of the internal space of the pocket 101 is lower than that outside of the internal space. Therefore, a part of the second film 110 is stuck to the first surface 130a of the electronic component 130 by this pressure, difference so that the electronic component 130 does not move freely in the pocket 101, if the apparatus is subjected to shock from outside of the apparatus. Not to move freely means that the electronic component 130 does not move to such an extent that insomuch terminal 131 of the electronic component 130 would become bent.

In the apparatus for storing the electronic component according to the first preferred embodiment of the present invention, the first surface of the electronic component is stuck to the second film by pressure difference. The electronic component is tightly fixed by the second film and the protrusion of the bottom of the first film. The electronic component does not move freely in the apparatus if the apparatus experiences shock from outside of the apparatus. Therefore, the apparatus for storing the electronic component according to the first preferred embodiment of the present invention avoids bending of the terminals of the electronic component during carrying.

Figure 2:
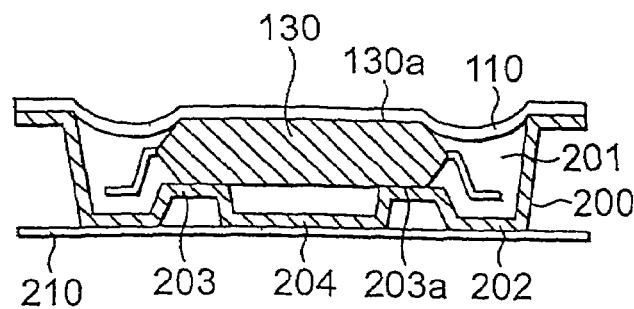
FIG. 2 is a cross sectional view of an apparatus for storing an electronic component according to a second preferred embodiment of the present invention.

An apparatus for storing an electronic component according to a second preferred embodiment of the present invention will be described with reference to FIG. 2. FIG. 2 is a cross sectional view of the apparatus according to the second preferred embodiment of the present invention. Also, FIG. 2 is the cross sectional view taken on line 1-1 of FIG. 1(a).

The apparatus for storing the electronic component 130 according to the second preferred embodiment of the present invention comprises a first film 200, the second film 110 and a third film 210. The first film 200 of the apparatus has a plurality of pockets 201 in series. Each pocket 201 stores a respective electronic component 130. The pocket 201 has two protrusions 203 at a bottom 202, wherein the tops 203a of each protrusion 203 contacts with the second surface 130b of the electronic component 130. Also, the first film 200 has a through hole 204 at the bottom 202 between two protrusions 203. The through hole 204 is used for automatic detection of presence of the electronic component 130 in the pocket 201. So, it is desirable that the through hole 204 is provided at bottom 202 right under the electronic component 130. The third film 210 covers the through hole 204 from beneath the first film 200. Accordingly, the first film 200 including the electronic component 130 is between the second film 110 and the third film 210.

The third film 210 also has a necessary flexibility to be winded onto a reel. In this preferred embodiment of the present invention, the material of the third film 210 may be polyethylene (PE), or polypropylene (PP), or the like.

In the apparatus for storing the electronic component according to the second preferred embodiment of the present invention, if the first film has a through hole, this invention is adapted without drastic changes. Therefore, the apparatus for storing the electronic component according to the second preferred embodiment of the present invention prevents a sharp rise of cost.

Figure 3:
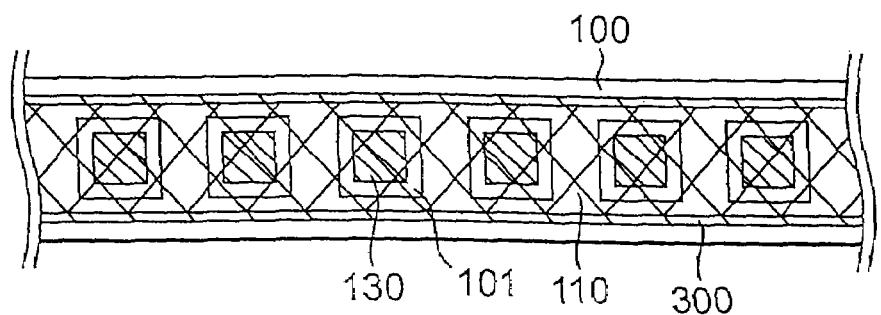
FIG. 3 is a top plan view of an apparatus for storing an electronic component according to a third preferred embodiment of the present invention.

An apparatus for storing an electronic component according to a third preferred embodiment of the present invention will be described with reference to FIG. 3. FIG. 3 is a top plan view of the apparatus according to the third preferred embodiment of the present invention.

The apparatus for storing the electronic component 130 according to the third preferred embodiment of the present invention comprises the first film 100 and the second film 110 as in the first preferred embodiment, and also includes a fourth film 300.

The fourth film 300 is bigger than the second film 110, and covers the second film 110. The apparatus is thus provided with a flexibility to be winded onto a reel. In this preferred embodiment of the present invention, the material of the fourth film 300 is polyethylene (PE), polyethylene terephthalate (PET), or polystyrene (PS), or the like.

In the apparatus for storing the electronic component according to the third preferred embodiment of the present invention, the fourth film 300 covers a joint between the first film 100 and the second film 110. The apparatus for storing the electronic component according to the third preferred embodiment of the present invention prevents the joint between the first and second films from leaking for a long time. Therefore, the apparatus for storing the electronic component according to the third preferred embodiment of the present invention prevents the terminal of the electronic component from being bent during carrying.

In addition, when a part of the fourth film sticks to a part of the second film, the second film is peeled away from the first film simultaneously when peeling away the fourth film from the first film. Therefore, the apparatus for storing the electronic component according to the third preferred embodiment of the present invention improves working efficiency.

Figure 4:
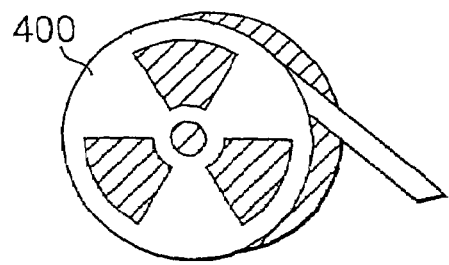
FIG. 4 is a perspective view of a reel including the apparatus for storing electronic components is winded thereon, according to a fourth preferred embodiment of the present invention.
Figure 5:
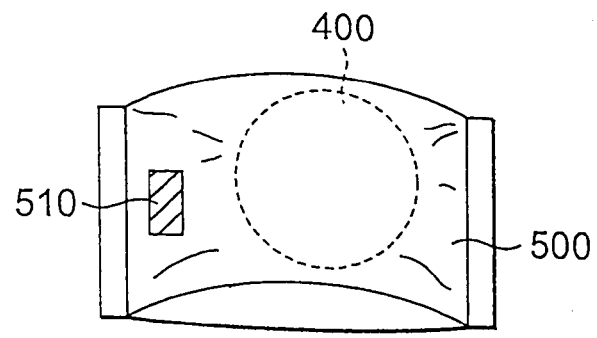
FIG. 5 is a perspective view of a bag including the reel stored therein apparatus according to the fourth preferred embodiment of the present invention.

A method for packing electronic components according to a fourth preferred embodiment of the present invention will be described with reference to FIGS. 4 and 5. FIG. 4 is a perspective view of a reel that the apparatus for storing electronic components is winded on according to the fourth preferred embodiment of the present invention. FIG. 5 is a perspective view of a bag in which the reel with the apparatus for storing electronic components winded thereon is stored, according to the fourth preferred embodiment of the present invention.

The electronic components are stored in an apparatus which is described in any of the first, second and third preferred embodiments. In a method for packaging the electronic components each having a first surface and an opposite second surface, first, an apparatus for storing the electronic components is prepared. The apparatus comprises a first film having a plurality of pockets in series that store the electronic components, wherein each pocket has a protrusion at a bottom, wherein a top of each protrusion contacts with the second surface of a respective electronic component; and a second film covering the pockets, wherein parts of the second film are stuck to the first surface of the electronic components by a pressure difference, so that the electronic components will not move freely. Second, a reel 400 is provided, and then, the apparatus is winded onto the reel 400. In addition, the reel 400 is placed into a bag 500 to be protected against dampness or static electricity. For example, the bag 500 is made of aluminum-laminate. If necessary, a desiccant 510 is provided in the bag 500. The reel 400 allows for compact storage of the apparatus, so that the apparatus may be carried easily.

According to the method for packing electronic components according to the fourth preferred embodiment of the present invention, the apparatus is protected against dampness and static electricity. Therefore, the method for packing electronic components according to the fourth preferred embodiment of the present invention causes reliability of the electronic components to improve.

Figure 6A:
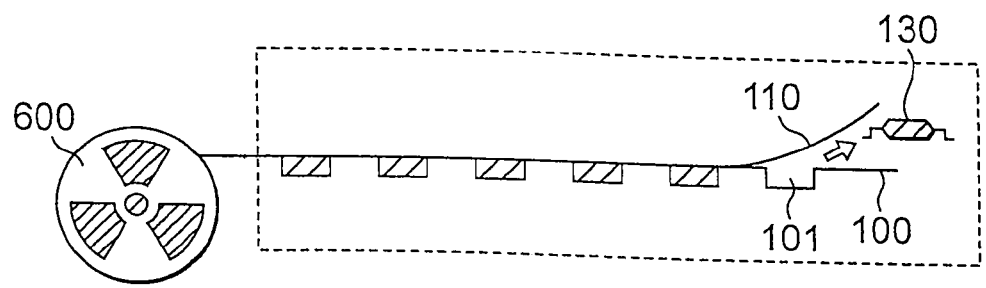
FIG. 6(a)-6(b) are cross sectional views for explaining mounting of an electronic component according to a fifth preferred embodiment of the present invention.
Figure 6B:
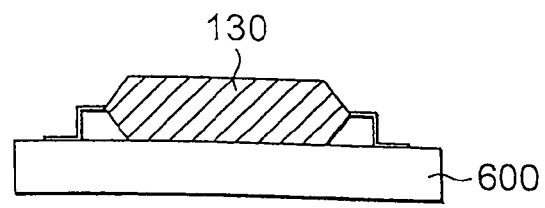

A method for packing electronic components according to a fifth preferred embodiment of the present invention will be described with reference to FIGS. 6(*a*) and 6(*b*). FIGS. 6(*a*)-6(*b*) are cross sectional views for explaining mounting of an electronic component according to the fifth preferred embodiment of the present invention.

The apparatus carried by the method mentioned in the above preferred fourth embodiment, is taken out from the bag 500. In the method for mounting an electronic component 130 having a first surface and an opposite second surface on a substrate, first, an apparatus for storing the electronic component 130 is prepared. The apparatus comprises a first film 100 having a plurality of pockets 101, where each pocket stores a respective electronic component 130, wherein each pocket 101 has a protrusion at a bottom, wherein a top of the protrusion contacts with the second surface of a respective electronic component 130; and a second film 110 covering the pockets 101, wherein parts of the second film 110 are stuck to the first surface of the respective electronic components 130 by a pressure difference, so that the electronic components 130 do not move freely. Next, the second film 110 is peeled away from the first film 100. Next, the electronic component 130 is extracted from the pocket 101, and then, the extracted electronic component 130 is mounted on the substrate 600 with solder materials.

In the method for packing electronic components according to the fifth preferred embodiment of the present invention, the apparatus prevents the electronic components from being exposed to dampness and static electricity, to thereby prevent cracks from forming in the electronic components. Therefore, the method for packing electronic components according to the fifth preferred embodiment of the present invention causes reliability of the electronic components to improve.

When the apparatus is as described in the second preferred embodiment, the third film 210 is peeled away from the first film 100 before the second film 110 is peeled away. Therefore, the through hole 204 is exposed, and then the electronic components 130 is detected using the through hole 204.

When the apparatus is as described in the third preferred embodiment, the second film 110 is peeled away from the first film 100 simultaneously when peeling away the fourth film 300 from the first film 100. Therefore, the apparatus for storing the electronic component according to the fifth preferred embodiment of the present invention improves working efficiency.

Figure 7A:
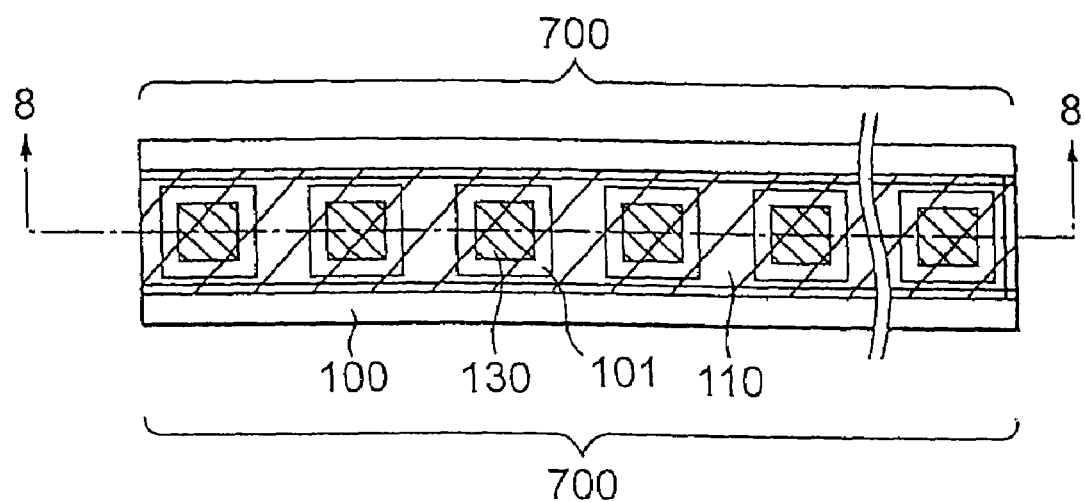
FIGS. 7(a)-7(b) are top plain views of an apparatus according to a sixth preferred embodiment of the present invention.
Figure 7B:
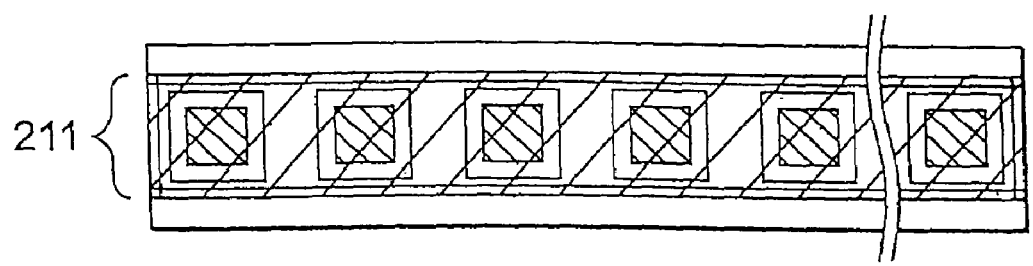
Figure 8A:
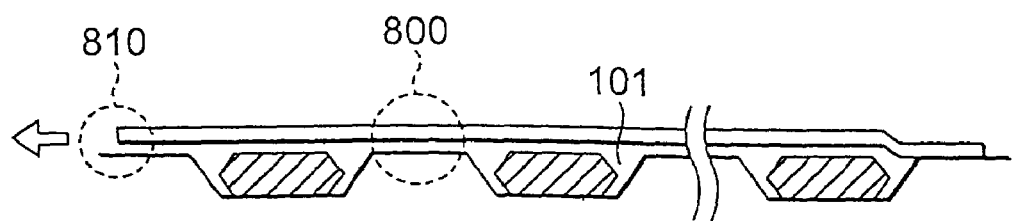
FIGS. 8(a)-8(b) are cross sectional views for explaining storing of an electronic component according to the sixth preferred embodiment of the present invention.
Figure 8B:
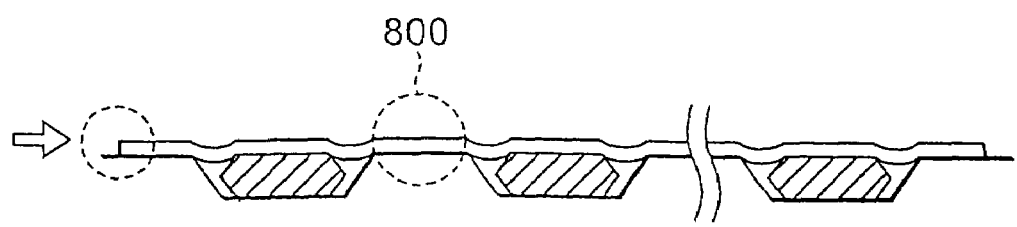
Figure 9:
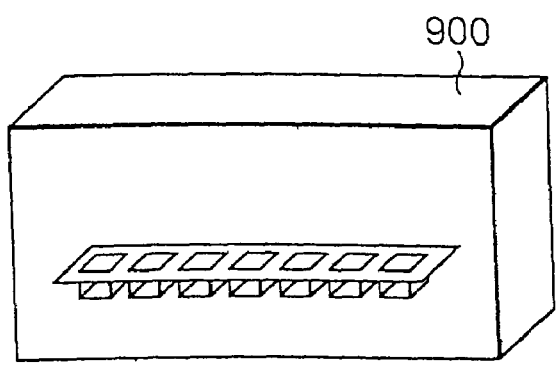
FIG. 9 is a perspective view of a decompression chamber according to the sixth preferred embodiment of the present invention.

A method for storing an electronic component according to a sixth preferred embodiment of the present invention will be described with reference to FIGS. 7-9. FIGS. 7(*a*)-7(*b*) are top plain views of an apparatus according to the sixth preferred embodiment of the present invention. FIGS. 8(*a*)-8(*b*) are cross sectional views for explaining storing of the electronic component according to the sixth preferred embodiment of the present invention, taken on line 8-8 of FIG. 7(*a*). FIG. 9 is a perspective view of a decompression chamber according to the sixth preferred embodiment of the present invention.

In the method for storing an electronic component, first, the electronic components 130 having a first surface and an opposite second surface are provided. Next, the first film 100 having a plurality of pockets 101 in series is prepared. Each pocket 101 stores a respective electronic component 130, and has a protrusion at a bottom. Next, respective electronic components 130 are placed into each of pockets 101 of the first film 100, wherein a top of the protrusions contact with the second surface of the respective electronic components 130. Next, a second film 110 covers over the pockets 101. Next, the second film 110 is adhered to the edge of the first film 100 such as at the rightmost portion of FIG. 8(*a*) by heat or glue to cover pockets 101, wherein first portions of the second film 110 are not adhered to the edges between the pockets 101. Therefore, the adjoining pockets have an opening 800 by which air freely comes and goes in the adjoining pockets. Also, a second portion of the second film 110 is not adhered to the long sides 700 of the first film 100 of FIG. 7(*a*). The second film 110 is a rectangle, and the second portion of that is formed at the long sides of the rectangle. Next, gas is removed from the pockets 101 from the second portion of the second film 110 in decompression chamber 900 as illustrated in FIG. 9, so that parts of the second film 110 contact the first surfaces of the electronic components 130, as illustrated in FIG. 8(*b*). Then, the second portion of the second film 110 is also adhered to the first film 100 by heat or glue.

In the method for storing an electronic component according to the sixth preferred embodiment of the present invention, the first surface of the electronic component is stuck to the second film by a pressure difference. The electronic component is tightly fixed by the second film and the protrusion of the bottom of the first film. The electronic component does not move freely in the apparatus if the apparatus is subject to extend shock. Therefore, the apparatus using the method of the sixth preferred embodiment of the present invention prevents the terminals of the electronic component from being bent during carrying. It should be understood that the second portion 810 may be located at any position along the periphery of the apparatus along the edge of the first film 100.

By the way, it is possible that the second portion of the second film 110 is formed at the short sides of the rectangular-shaped films for example. It is useful for the case that the first and second films 100 and 110 are adhered to each other while they are winded onto the reel 400 in FIG. 4. In this case, it is not necessary to stop winding.

Furthermore, a method for removing gas from the pocket will be described in detail with reference to FIG. 9. First, the first film 100 having the electronic components 130 stored in the pockets 101 and being covered with the second film 110 (thereafter an apparatus), is placed into a decompression chamber 900 shown in FIG. 9. Next, pressure of the decompression chamber 900 is reduced. And then, gas is removed from the pockets 101 at the second portion of the second film 110. When pressure of the decompression chamber 900 is reduced, pressure of the pockets 101 is higher than that of decompression chamber 900. So, gas in the pockets 101 moves to outside of the pockets 101. Therefore, pressure of the pockets 101 is reduced.

When the apparatus is taken out from the decompression chamber 900, pressure of the pockets 101 is lower than that of outside of it. Therefore, there are no large openings at the first and second portions of the second film 110. As a result, an amount of gas which enters the pockets 101 through the first and second portions of the second film 110 is small. Immediately after the apparatus is taken out from the decompression chamber 900, the second portion of the second film 110 is adhered to the pocket 101 by heat or glue. Therefore, the electronic components 130 are fixed enough, so that they do not move freely. Thereby, an amount of pressure of the decompression chamber 900 depends on pressure external of the decompression chamber 900. In other words, it is enough that pressure of the decompression chamber 900 is reduced to such an extent that the apparatus is fixed when it is taken out from the decompression chamber 900. In the method for removing gas from the pocket, by just reducing pressure of the decompression chamber 900, gas within the pockets is removed easily.

While the preferred form of the present invention has been described, it is to be understood that modifications will be apparent to those skilled in the art without departing from the spirit of the invention.

The scope of the invention, therefore, is to be determined solely by the following claims.

What is claimed:

1. method for mounting an electronic component having a first surface and an opposite second surface on a substrate, comprising:
    preparing an apparatus for storing the electronic component, wherein the apparatus comprises
        a first film having a pocket that stores the electronic component, and wherein the pocket has a protrusion at a bottom, and wherein a top of the protrusion contacts with the second surface of the electronic component, and
        a second film covering the pocket, and wherein a part of the second film is stuck to the first surface of the electronic component by a pressure difference, so that the electronic component does not move freely;
    peeling away the second film from the apparatus;
    extracting the electronic component from the pocket; and
    mounting the extracted electronic component on the substrate.

2. The method according to claim 1, wherein said first and second films are made of an organic substance.

3. A method for mounting an electronic component having a first surface and an opposite second surface on a substrate, comprising:
    preparing an apparatus for storing the electronic component, wherein the apparatus comprises
        a first film having a pocket that stores the electronic component, and wherein the pocket has a protrusion at a bottom, and wherein a top of the protrusion contacts with the second surface of the electronic component and wherein the bottom of the pocket has a through hole, and
        a second film covering the pocket, and wherein a part of the second film is stuck to the first surface of the electronic component by a pressure difference so that the electronic component does not move freely, and
        a third film covering the through hole;
    peeling away the third film from the apparatus;
    peeling away the second film from the apparatus;
    extracting the electronic component from the pocket; and
    mounting the extracted electronic component on the substrate.

4. The method according to claim 3, wherein said first and second films are made of an organic substance.

5. A method for mounting an electronic component having a first surface and an opposite second surface on a substrate, comprising:
    preparing an apparatus for storing the electronic component, wherein the apparatus comprises
        a first film having a pocket that stores the electronic component, and wherein the pocket has a protrusion at a bottom, and wherein a top of the protrusion contacts with the second surface of the electronic component,
        a second film covering the pocket, and wherein a part of the second film is stuck to the first surface of the electronic component by a pressure difference so that the electronic component does not move freely, and
        a third film covering the second film;
    peeling away the second and third films from the apparatus;
    extracting the electronic component from the pocket; and
    mounting the extracted electronic component on the substrate.

6. The method according to claim 5, wherein said first and second films are made of an organic substance.

7. A method for mounting an electronic component having a first surface and an opposite second surface on a substrate, comprising:
    preparing an apparatus for storing the electronic component, wherein the apparatus comprises
        a first film having a front surface and a back surface opposite the front surface, and having a pocket that stores the electronic component on the front surface, and wherein the front surface of the first film protrudes from a bottom of the pocket to provide a protrusion within the pocket and a hollow along the back surface of the first film under the protrusion, and wherein a top of the protrusion contacts with the second surface of the electronic component, and
        a second film covering the pocket, and wherein a part of the second film is stuck to the first surface of the electronic component by a pressure difference, so that the electronic component does not move freely;
    peeling away the second film from the apparatus;
    extracting the electronic component from the pocket; and
    mounting the extracted electronic component on the substrate.

8. The apparatus according to claim 7, wherein said first and second films are made of an organic substance.

* * * * *